(12) United States Patent
Yen et al.

(10) Patent No.: US 10,497,507 B2
(45) Date of Patent: Dec. 3, 2019

(54) SEMICONDUCTOR ELEMENT

(71) Applicant: REALTEK SEMICONDUCTOR CORPORATION, Hsinchu (TW)

(72) Inventors: Hsiao-Tsung Yen, Hsinchu (TW); Cheng-Wei Luo, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/649,347

(22) Filed: Jul. 13, 2017

(65) Prior Publication Data

US 2018/0040411 A1  Feb. 8, 2018

(30) Foreign Application Priority Data

Aug. 5, 2016  (TW) .............................. 105124988 A

(51) Int. Cl.
| | | |
|---|---|---|
| *H01F 5/00* | (2006.01) | |
| *H01F 27/28* | (2006.01) | |
| *H01F 27/29* | (2006.01) | |
| *H01L 23/522* | (2006.01) | |
| *H01L 49/02* | (2006.01) | |

(52) U.S. Cl.
CPC ......... *H01F 27/2804* (2013.01); *H01F 27/29* (2013.01); *H01L 23/5227* (2013.01); *H01L 28/10* (2013.01); *H01F 2027/2809* (2013.01)

(58) Field of Classification Search
CPC .............................................. H01F 2017/0073
USPC ......................................................... 336/225
See application file for complete search history.

(56) References Cited

U.S. PATENT DOCUMENTS

| | | |
|---|---|---|
| 6,577,219 B2 | 6/2003 | Visser |
| 7,151,430 B2 | 12/2006 | Mattsson |
| (Continued) | | |

FOREIGN PATENT DOCUMENTS

| | | |
|---|---|---|
| CN | 1522450 A | 8/2004 |
| CN | 1522450 A | 8/2004 |
| (Continued) | | |

OTHER PUBLICATIONS

Taiwan Intellectual Property Office, "Office Action", dated Feb. 2, 2018. Summary: The OA letter recites that TW201248658 and JP2005327931A render claims 1-3 obvious.

(Continued)

*Primary Examiner* — Ronald Hinson
(74) *Attorney, Agent, or Firm* — WPAT, PC

(57) ABSTRACT

A semiconductor element fabricated in a semiconductor structure and coupled to an application circuit through at least two connecting terminals. The semiconductor element includes a first spiral coil, a second spiral coil and a connecting portion. The first spiral coil is substantially located in a first metal layer and formed with a first end and a second end. The second spiral coil is substantially located in the first metal layer and formed with a third end and a fourth end. The connecting portion, which is located in a second metal layer, connects the second end and the fourth end. The first end is used as one of the two connecting terminals and the third end is used as the other of the two connecting terminals. The second metal layer is different from the first metal layer.

20 Claims, 8 Drawing Sheets

(56) References Cited

U.S. PATENT DOCUMENTS

| | | | |
|---|---|---|---|
| 8,008,978 B2* | 8/2011 | Deguchi | H03K 5/1565 331/1 R |
| 8,183,971 B2 | 5/2012 | Le Guillou et al. | |
| 8,305,182 B1 | 11/2012 | Tsai | |
| 8,543,190 B2* | 9/2013 | Wasson | H01F 5/003 336/180 |
| 9,299,764 B2 | 3/2016 | Mattsson et al. | |
| 2003/0001709 A1* | 1/2003 | Visser | H01F 17/0006 336/200 |
| 2007/0158782 A1 | 7/2007 | Heikkinen | |
| 2009/0045903 A1 | 2/2009 | Lin et al. | |
| 2010/0164667 A1* | 7/2010 | Ho-Hsiang | H01F 17/0006 336/137 |
| 2015/0206634 A1* | 7/2015 | Yan | H01F 17/0006 336/182 |
| 2016/0118180 A1 | 4/2016 | Chen et al. | |
| 2017/0012601 A1 | 1/2017 | Yen | |
| 2017/0098500 A1 | 4/2017 | Yen et al. | |
| 2017/0200547 A1 | 7/2017 | Yen et al. | |

FOREIGN PATENT DOCUMENTS

| | | |
|---|---|---|
| CN | 101253586 A | 8/2008 |
| CN | 101673865 B | 2/2014 |
| CN | 104584152 A | 4/2015 |
| JP | 2005327931 A | 11/2005 |
| TW | 201248658 | 12/2012 |

OTHER PUBLICATIONS

OA letter of the CN application (appl. No. 201610663400.X) dated Mar. 4, 2019. Summary of the CN OA letter(appl. No. 201610663400.X): Claims 1-10 are rendered obvious by references 1 (CN101253586A) and 2(CN104584152A).

OA letter of the CN application (appl. No. 201610665108.1) dated Mar. 4, 2019. Summary of the CN OA letter (appl. No. 201610665108.1): Claims 1-8 are rendered obvious by references 1 (CN104584152A) and 2(CN101253586A).

National Intellectual Property Administration of the People's Republic of China (PRC), Office Action dated Oct. 22, 2018. English summary on p. 1.

OA letter of application No. 15649465 dated Nov. 27, 2018.

OA letter of application No. 15649503 dated Nov. 29, 2018.

OA letter of a US application (U.S. Appl. No. 15/649,503) dated Aug. 1, 2019.

* cited by examiner

SEMICONDUCTOR ELEMENT

BACKGROUND OF THE INVENTION

1. Field of the Invention

The present invention relates to semiconductor element, especially to an integrated inductor and an integrated transformer.

2. Description of Related Art

Inductors and transformers are important elements in radio frequency integrated circuits to implement single-ended to differential signal conversion, signal coupling and impedance matching. As System-on-chips (SoCs) become the mainstream of integrated circuits, integrated inductors and integrated transformers are gradually substituted for conventional discrete elements and are commonly applied to radio frequency integrated circuits. However, inductors and transformers in integrated circuits often take up large areas; therefore, it becomes an important issue to reduce the areas of inductors and transformers in integrated circuits without degrading element performances, such as inductance, quality factor (Q), and coupling coefficient (K).

FIG. 1 illustrates a structure of a conventional 8-shaped integrated inductor. An 8-shaped integrated inductor 100 includes a spiral coil 110 and a spiral coil 120. The spiral coil 110 (120) includes a metal segment 112 (122) and a metal segment 114 (124). The metal segment 112 (122) and the metal segment 114 (124) are connected by through structures at through positions. The through structures can be via structures or a via array. In operation, signals are inputted at one connecting terminal 111 (or 121) of the 8-shaped integrated inductor 100 and outputted at the other connecting terminal 121 (or 111). The 8-shaped integrated inductor 100 has an obvious drawback, that the spiral coil 110 or the spiral coil 120 itself has unsatisfactory symmetry, causing poor performances of the quality factor and the inductance value of the 8-shaped integrated inductor 100. Moreover, the two connecting terminals 111 and 121 of the 8-shaped integrated inductor 100 are distant from each other, such that the connection with differential elements in an integrated circuit becomes difficult (which becomes even more apparent as the numbers of turns of the spiral coils get greater).

SUMMARY OF THE INVENTION

In view of the issues of the prior art, an object of the present invention is to provide a semiconductor element to improve the performance and usability of integrated inductors and integrated transformers, so as to make an improvement to the prior art.

The present invention discloses a semiconductor element, implemented in a semiconductor structure and coupled to an application circuit through at least two connecting terminals. The semiconductor element includes a first spiral coil, a second spiral coil, a first guide segment, a second guide segment, and a connecting section. The first spiral coil is substantially located in a first metal layer and formed with a first end and a second end. The second spiral coil is substantially located in said first metal layer and formed with a third end and a fourth end. The first guide segment is connected to said first end and one of said two connecting terminals. The second guide segment is connected to said third end and the other of said two connecting terminals. The connecting section is located in a second metal layer and connected to said second end and said fourth end. The second metal layer is different from said first metal layer.

The present invention also discloses a semiconductor element, implemented in a semiconductor structure and coupled to an application circuit through at least two connecting terminals. The semiconductor element includes a first spiral coil, a second spiral coil, and a connecting section. The first spiral coil is substantially located in a first metal layer and formed with a first end and a second end. The first end is one of said two connecting terminals. The second spiral coil is substantially located in said first metal layer and formed with a third end and a fourth end. The third end is the other of said two connecting terminals. The connecting section is located in a second metal layer and connects said second end and said fourth end. The second metal layer is different from said first metal layer.

In the present invention, two spiral coils of a semiconductor element are connected by a connecting section. A relative position between the connecting section and the spiral coils varies in accordance with a practical use of the semiconductor element. In comparison with the prior art, the semiconductor element disposed in the present invention is better in symmetry and is more flexible in structure, such that the semiconductor element can be connected to application circuits in a more effective manner. Moreover, the semiconductor element disclosed in the present invention can achieve different magnetic field coupling effects by altering the ways the spiral coils are connected.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
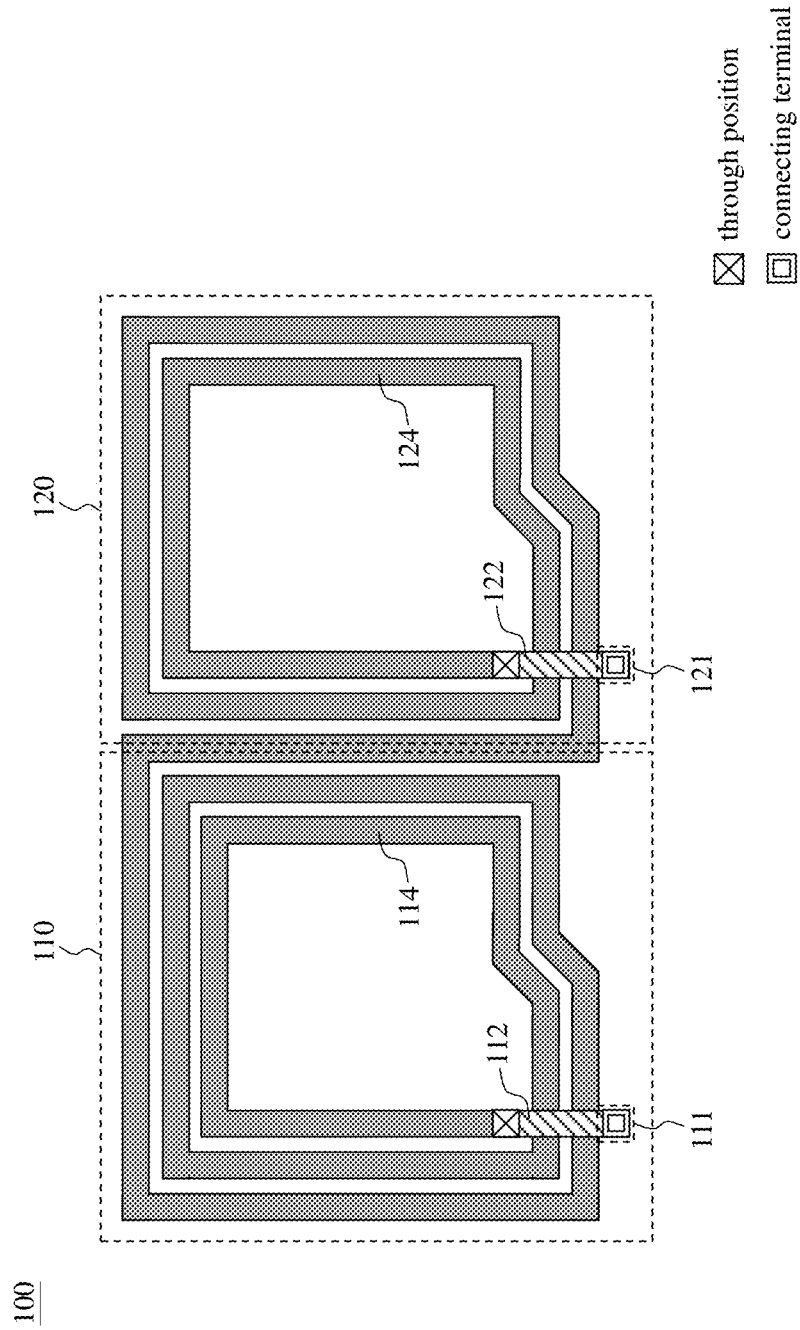
FIG. 1 illustrates a structure of a conventional 8-shaped integrated inductor.
Figure 2:
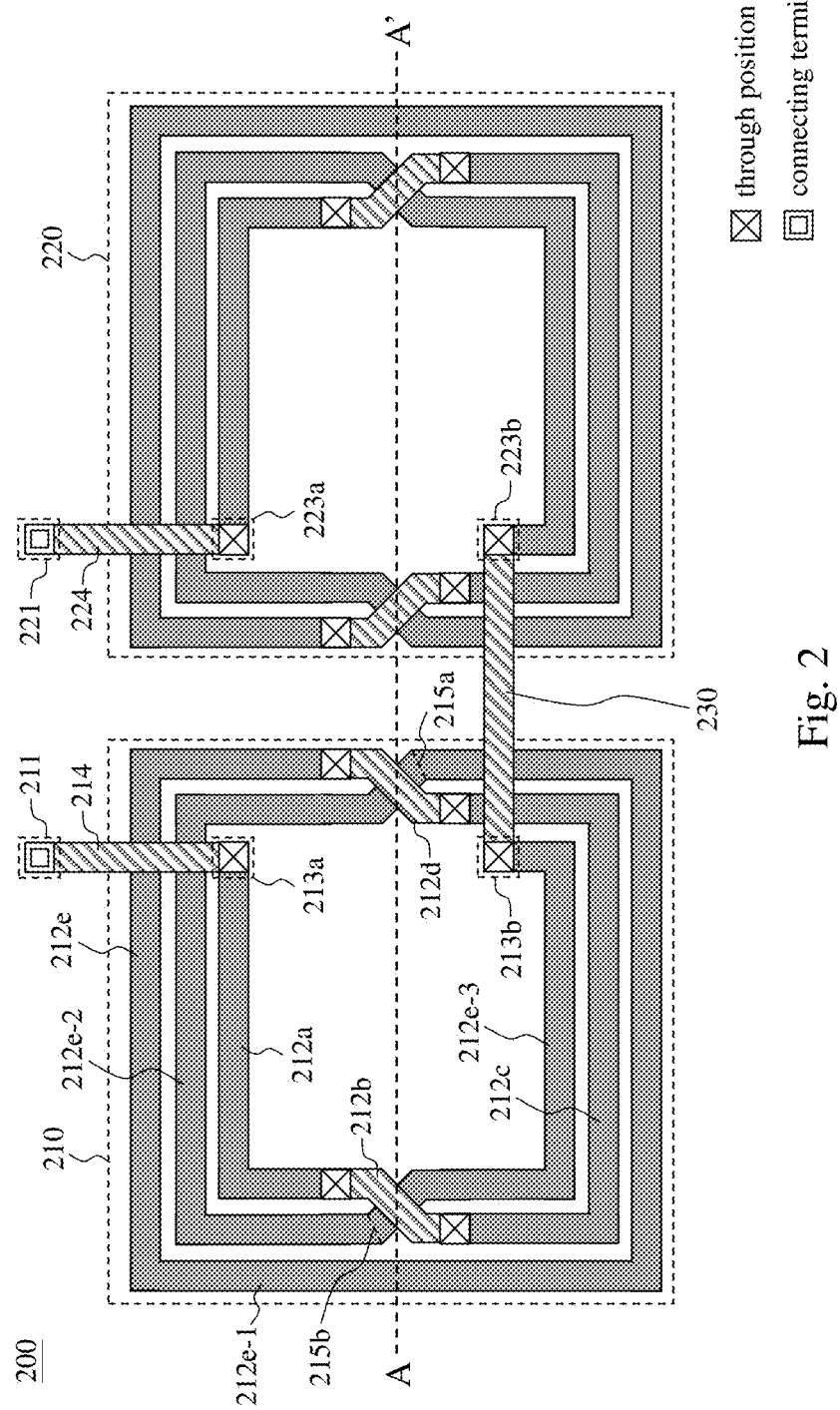
FIG. 2 illustrates a structure of a semiconductor element according to an embodiment of the present invention.

FIG. 2 shows a structure of a semiconductor element according to an embodiment of the present invention. The semiconductor element 200 includes two spiral coils 210 and 220. The spiral coils 210 and 220 are connected by a connecting section 230. As an example, the connecting section 230 can be formed by a metal segment. In this embodiment, the spiral coil 210 includes the metal segments 212a-212e. The metal segments 212b and 212d are fabricated in an upper metal layer (shaded by slanted lines), whereas the remaining metal segments are fabricated in a lower metal layer (shaded in gray). Since the metal segments 212b and 212d take up only a relatively small portion of the spiral coil 210, the spiral coil 210 is substantially located in a same metal layer. One end of the metal segment 212e connects the metal segment 212d, and the other end of the metal segment 212e connects the end 213b. For reason of thorough explanation, in FIG. 2 the metal segment 212e is particularly marked as three metal sub-segments, which are metal sub-segments 212e-1, 212e-2, 212e-3 and are divided by the broken lines 215a and 215b. The spiral coil 210 is a three-turn spiral structure, of which the inner turn is located in a range substantially surrounded by the outer turn. The outer turn of the spiral coil 210 includes the metal sub-segment 212e-1, the middle turn of the spiral coil 210 includes a metal sub-segment 212e-2 and a metal segment 212c, and the inner turn of the spiral coil 210 includes a metal sub-segment 212e-3 and a metal segment 212a. The spiral coil 210 includes ends 213a and 213b, both of which are located at the inner turn thereof. The spiral coil 220 has a structure similar to that of the spiral coil 210, and thus related descriptions are omitted for brevity. The spiral coil 210 and the spiral coil 220 are substantially located in the same metal layer.

The semiconductor element 200 is fabricated in a semiconductor structure. The metal layer shaded by slanted lines and the metal layer shaded in gray can be the ultra-thick metal (UTM) layer and the re-distribution layer (RDL) of the semiconductor structure, or other metal layers. The semiconductor element 200 is coupled to an application circuit through the connecting terminals 211 and 221. For example, the application circuit can be a radio frequency circuit or another integrated circuit that makes use of inductors and/or transformers. The application circuit can be fabricated in the same semiconductor structure. The connecting terminal 211 is connected to an end 213a of the spiral coil 210 through a guide segment 214, and the connecting terminal 221 is connected to an end 223a of the spiral coil 220 through a guide segment 224. The end 213a and end 223a themselves can be the connecting terminals through which the semiconductor element 200 couples other elements. The guide segments 214 and 224 are provided to improve the convenience of coupling. In addition, the connecting section 230 connects the spiral coil 210 and the spiral coil 220 through the ends 213b and 223b. The metal segments located in different metal layers are connected by the through structures at the through positions in the drawings. The through structures can be via structures, a via array or through-silicon vias (TSVs).

As shown in FIG. 2, the spiral coil 210 is a substantially symmetric structure (symmetric with respect to an axis of symmetry A-A'). Similarly, the spiral coil 220 is a substantially symmetric structure as well. The end 213a and end 213b of the spiral coil 210 are located on different sides of the axis of symmetry A-A'; similarly, the end 223a and end 223b of the spiral coil 220 are located on different sides of the axis of symmetry A-A'. In addition, two connecting terminals 211 and 221 of the semiconductor element 200 are respectively connected to the spiral coils 210 and 220, and are located on the same edge of the semiconductor element 200. The edge is substantially parallel to the axis of symmetry A-A'. The innermost turn of the spiral coil 210 includes an opening, which is the portion without metal segments between the ends 213a and 213b. The innermost turn of the spiral coil 220 includes an opening, which is the portion without metal segments between the ends 223a and 223b. A direction of opening of the innermost turn of the spiral coil 210 and that of the innermost turn of the spiral coil 220 are different by approximately 180 degrees. In this embodiment, the directions of openings of the innermost turns of the spiral coil 210 and spiral coil 220 both face the connecting section 230. In one embodiment, when an application circuit coupled to the semiconductor element 200 processes differential signals (i.e., the connecting terminals 211 and 221 are coupled to a differential signal pair of the application circuit), one of the directions of the electric currents flowing through the spiral coils 210 and 220 is clockwise, whereas the other is counterclockwise. When the signals that the application circuit processes are not differential signals, the directions of the electric currents flowing through the spiral coils 210 and 220 are both clockwise or counterclockwise.

When the semiconductor element 200 is used as an integrated inductor (e.g., an 8-shaped integrated inductor), the center tap of the integrated inductor is connected to the connecting section 230. More specifically, when used as an integrated inductor, the semiconductor element 200 includes two inductive units. One of the two inductive units uses the spiral coil 210 as a body, and uses the connecting terminal 211 (equivalent to the end 213a) and the center tap (equivalent to the end 213b) as its two ends; the other of the two inductive units uses the spiral coil 220 as a body, and uses the connecting terminal 221 (equivalent to the end 223a) and the center tap (equivalent to the end 223b) as its two ends. When the semiconductor element 200 is used as an integrated transformer, two semiconductor elements 200 are used, with one of which implemented in the spacing between metal segments of the other (i.e., the spacing between the metal segments of one of the two semiconductor elements 200 is large enough to receive the metal segments of the other). In the integrated transformer application, some metal segments may be implemented in a third or fourth metal layer. When completed, the two connecting terminals of one of the two semiconductor elements 200 are used as an input port of the integrated transformer, while the two connecting terminals of the other are used as an output port.

Figure 3:
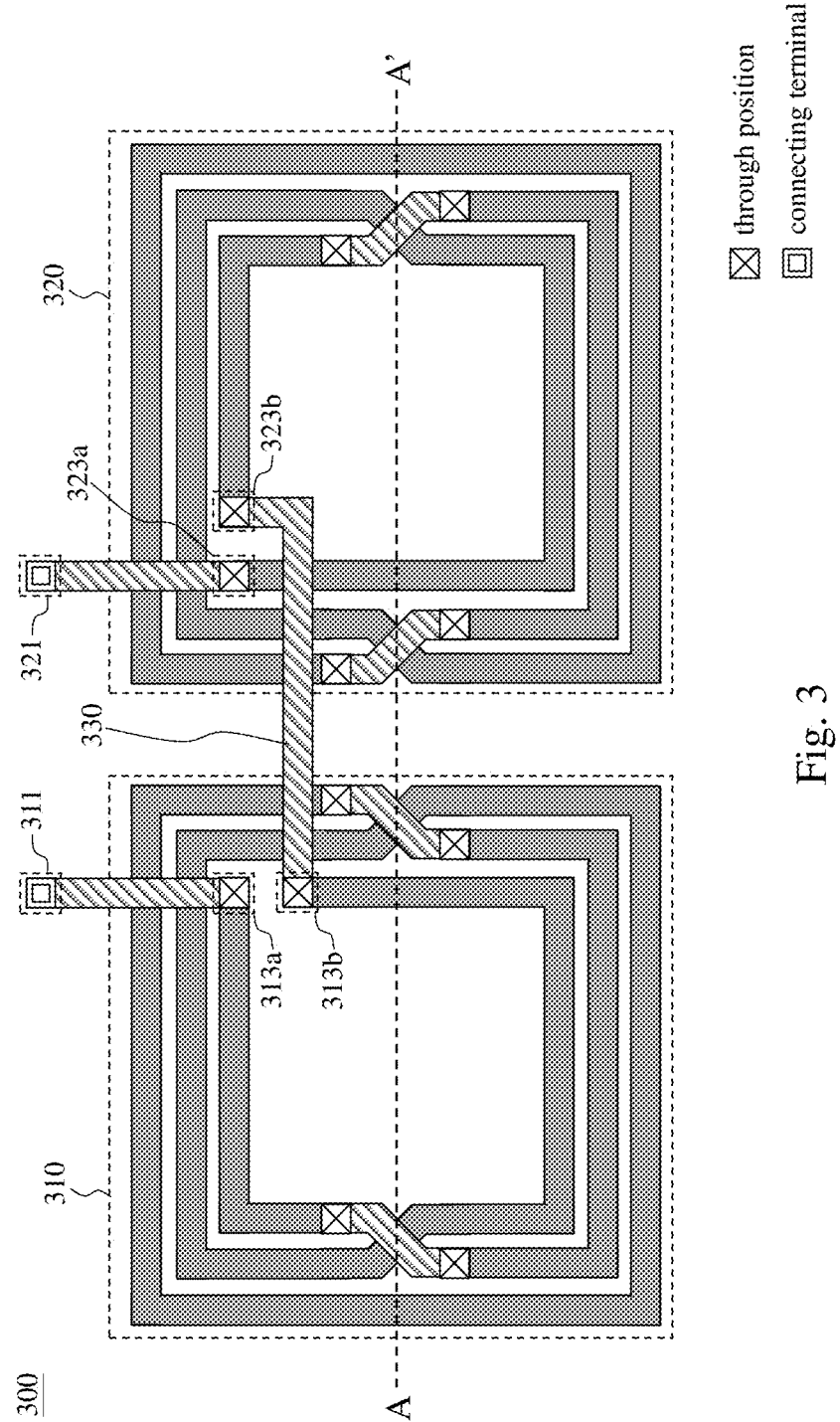
FIG. 3 illustrates a structure of a semiconductor element according to another embodiment of the present invention.

FIG. 3 shows a structure of a semiconductor element according to another embodiment of the present invention. The semiconductor element 300 includes two spiral coils 310 and 320. The spiral coils 310 and 320 are connected by a connecting section 330. As an example, the connecting section 330 can be formed by a metal segment. In this embodiment, the spiral coils 310 and 320 are both three-turn spiral structures, of which the inner turn is located in a range substantially surrounded by the outer turn. The spiral coil 310 includes ends 313a and 313b, both of which are located at the inner turn thereof, and the spiral coil 320 includes ends 323a and 323b, both of which are also located at the inner turn thereof. The spiral coil 310 and the spiral coil 320 are substantially located in a same metal layer.

As shown in FIG. 3, the spiral coil 310 is a substantially symmetric structure (symmetric with respect to an axis of symmetry A-A'). Similarly, the spiral coil 320 is a substantially symmetric structure as well. The end 313a and end 313b of the spiral coil 310 are located on a same side of the axis of symmetry A-A'. Similarly, the end 323a and end 323b of the spiral coil 320 are located on a same side of the axis of symmetry A-N. Moreover, the two connecting terminals 311 and 321 of the semiconductor element 300 are respectively connected to the spiral coils 310 and 320, and are located on a same edge of the semiconductor element 300. The edge is substantially parallel to the axis of symmetry A-A'. The innermost turn of the spiral coil 310 includes an opening, which is the portion without metal segments between the ends 313a and 313b. The innermost turn of the spiral coil 320 includes an opening, which is the portion without metal segments between the ends 323a and 323b. A direction of opening of the innermost turn of the spiral coil 310 and that of the innermost turn of the spiral coil 320 are different by approximately 90 degrees. For example, as shown in FIG. 3, one faces right while the other faces up. In one embodiment, when an application circuit coupled to the semiconductor element 300 processes differential signals (i.e., the connecting terminals 311 and 321 are coupled to a differential signal pair of the application circuit), the directions of the electric currents flowing through the spiral coils 310 and 320 are both clockwise or counterclockwise. When the signals that the application circuit processes are not differential signals, one of the directions of the electric currents flowing through the spiral coils 310 and 320 is clockwise, whereas the other is counterclockwise.

Figure 4:
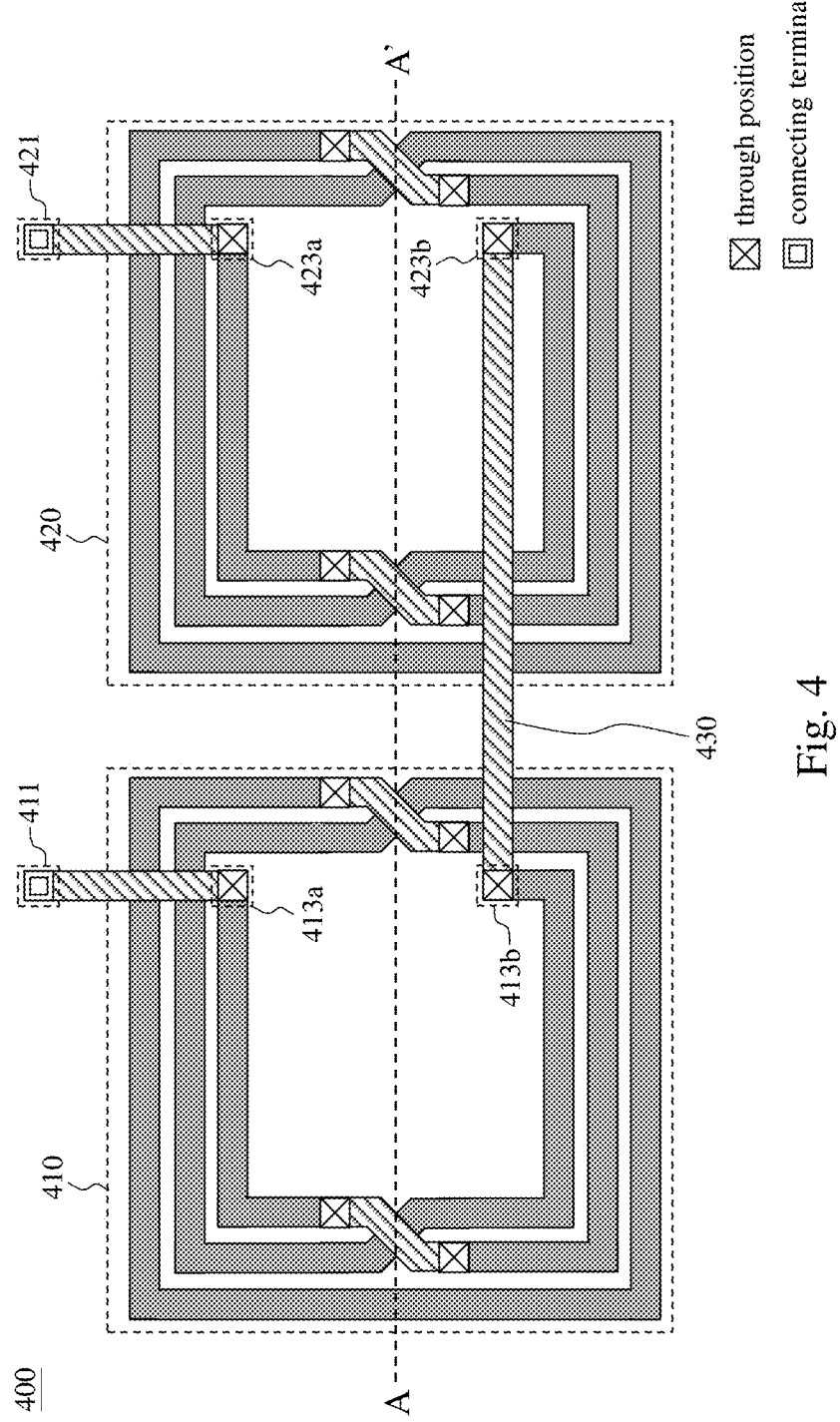
FIG. 4 illustrates a structure of a semiconductor element according to another embodiment of the present invention.

FIG. 4 shows a structure of a semiconductor element according to another embodiment of the present invention. The semiconductor element 400 includes two spiral coils 410 and 420. The spiral coils 410 and 420 are connected by a connecting section 430. As an example, the connecting section 430 can be formed by a metal segment. In this embodiment, the spiral coils 410 and 420 are both three-turn spiral structures, each having its inner turn located in a range substantially surrounded by its outer turn. The spiral coil 410 includes ends 413a and 413b, both of which are located at the inner turn thereof. The spiral coil 420 includes ends 423a and 423b, both of which are also located at the inner turn thereof. The spiral coil 410 and the spiral coil 420 are substantially located in a same metal layer.

As shown in FIG. 4, the spiral coil 410 is a substantially symmetric structure (symmetric with respect to an axis of symmetry A-A'). Similarly, the spiral coil 420 is a substantially symmetric structure as well. The end 413a and end 413b of the spiral coil 410 are located on different sides of the axis of symmetry A-A'. Similarly, the end 423a and end 423b of the spiral coil 420 are located on different sides of the axis of symmetry A-A'. In addition, two connecting terminals 411 and 421 of the semiconductor element 400 are respectively connected to the spiral coils 410 and 420, and are located on a same edge of the semiconductor element 400. The edge is substantially parallel to the axis of symmetry A-A'. The innermost turn of the spiral coil 410 includes an opening, which is the portion without metal segments between the ends 413a and 413b. The innermost turn of the spiral coil 420 includes an opening, which is the portion without metal segments between the ends 423a and 423b. A direction of opening of the innermost turn of the spiral coil 410 and that of the innermost turn of the spiral coil 420 face a same direction. For example, as shown in FIG. 4, the directions of openings of the innermost turns of the spiral coil 410 and spiral coil 420 both face right. In one embodiment, when an application circuit coupled to the semiconductor element 400 processes differential signals (i.e., the connecting terminals 411 and 421 are coupled to a differential signal pair of the application circuit), the directions of the electric currents flowing through the spiral coils 410 and 420 are both clockwise or counterclockwise. When the signals that the application circuit processes are not differential signals, one of the directions of the electric currents flowing through the spiral coils 410 and 420 is clockwise, whereas the other is counterclockwise.

Similar to the semiconductor element 200, the semiconductor element 300 and semiconductor element 400 can be the bodies of integrated inductors or integrated transformers. The details are omitted for brevity.

Figure 5:
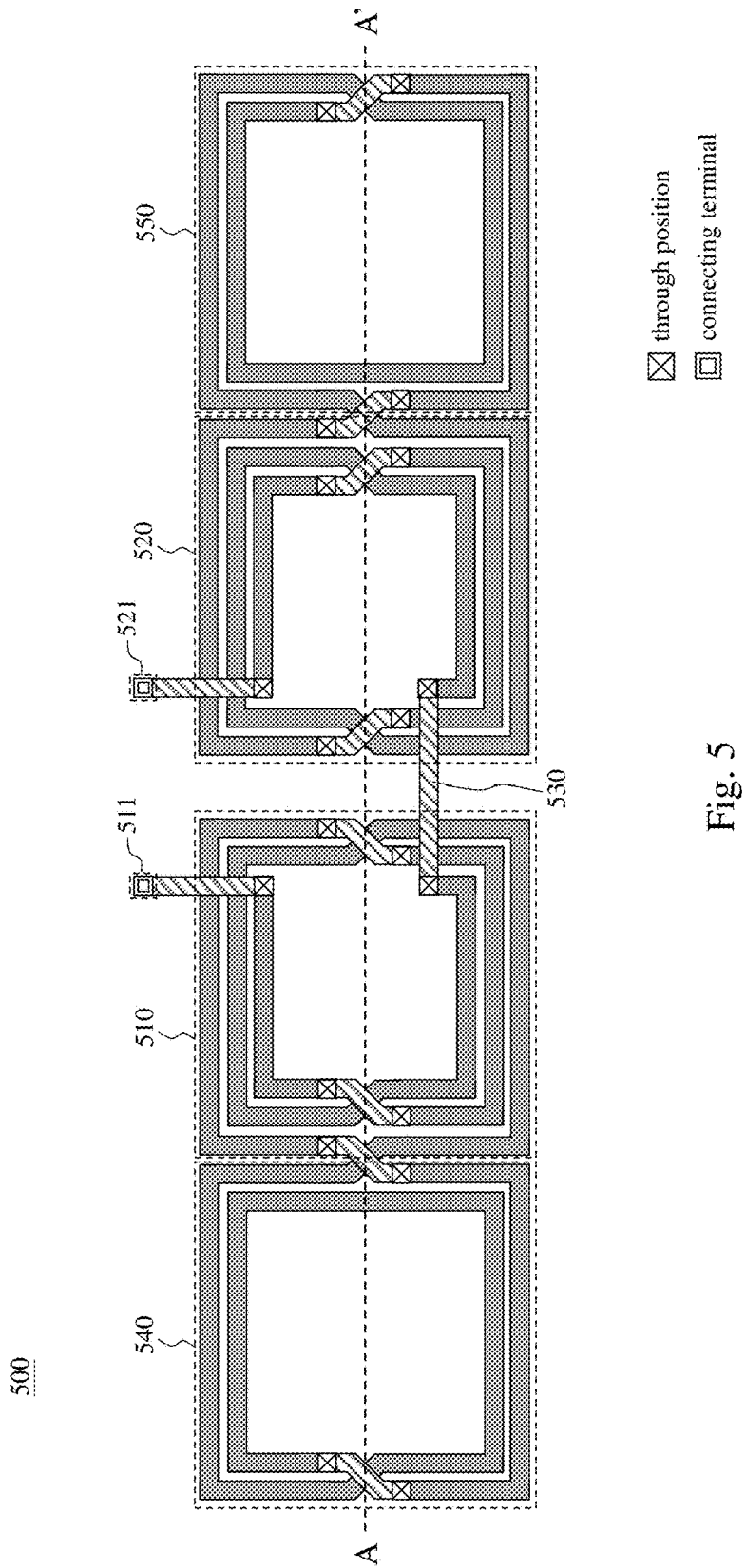
FIG. 5 illustrates a structure of a semiconductor element according to another embodiment of the present invention.

FIG. 5 shows a structure of a semiconductor element according to another embodiment of the present invention. The semiconductor element 500 includes spiral coils 510, 520, 540 and 550. The spiral coils 510 and 520 are connected by a connecting section 530. The spiral coil 510, spiral coil 520 and connecting section 530 together form a structure similar to the semiconductor element 200, and thus the details are omitted for brevity. The spiral coils 540 and 550 are directly connected to the spiral coils 510 and 520, respectively. In one embodiment, when an application circuit coupled to the semiconductor element 500 processes differential signals (i.e., the connecting terminals 511 and 521 are coupled to a differential signal pair of the application circuit), one of the directions of the electric currents flowing through the spiral coils 510 and 520 is clockwise, whereas the other is counterclockwise. The direction of the electric current flowing through the spiral coil 540 is opposite to that of the electric current flowing through the spiral coil 510, and the direction of the electric current flowing through the spiral coil 550 is opposite to that of the electric current flowing through the spiral coil 520. As an exemplary embodiment shown in FIG. 5, the spiral coils 540 and 550 are two-turn structures, but the number of turns may be different in another embodiment. The spiral coils 540 and 550 can be implemented in metal layers different from the spiral coils 510 and 520.

Figure 6:
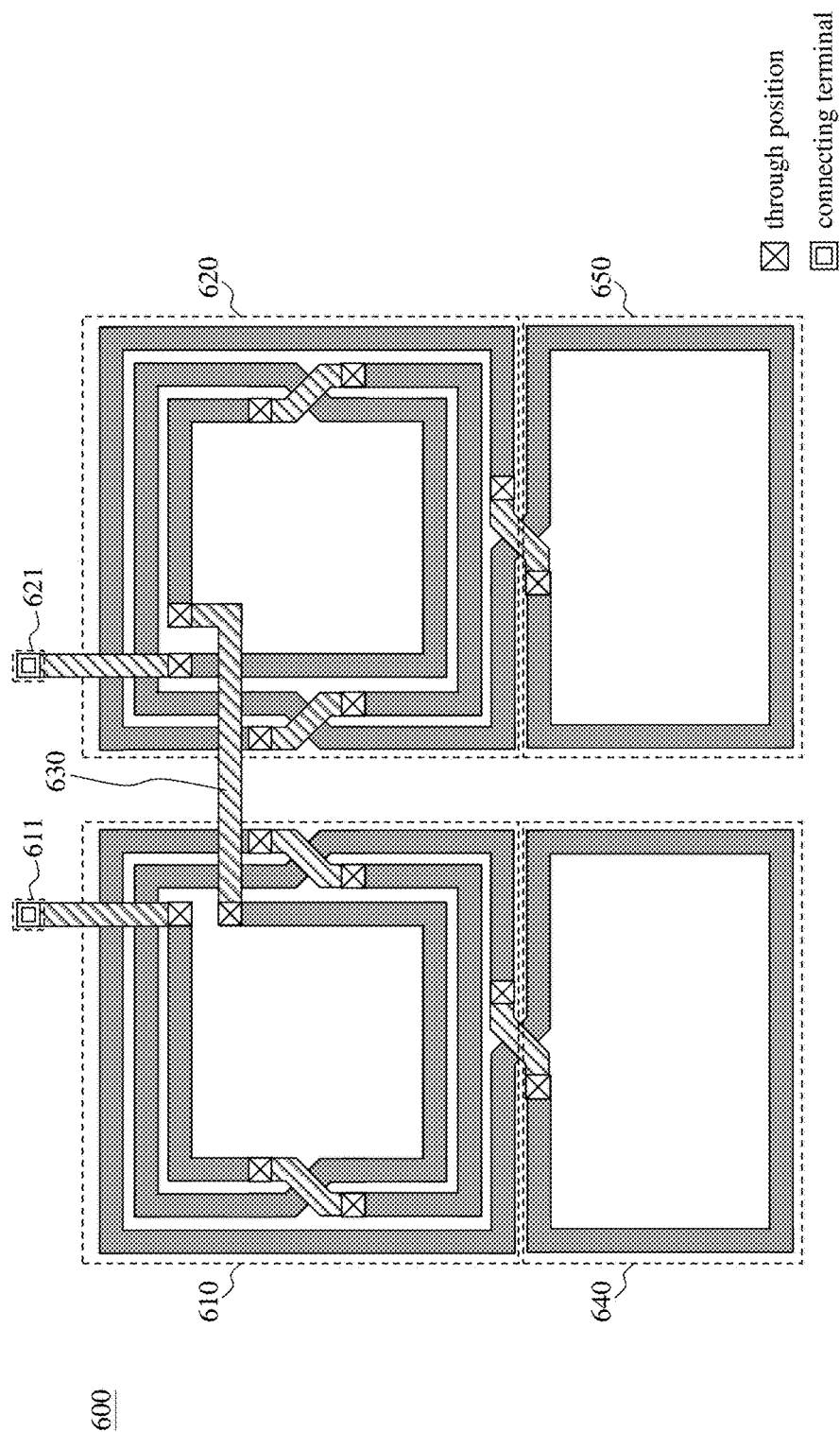
FIG. 6 illustrates a structure of a semiconductor element according to another embodiment of the present invention.

FIG. 6 shows a structure of a semiconductor element according to another embodiment of the present invention. The semiconductor element 600 includes spiral coils 610, 620, 640 and 650. The spiral coils 610 and 620 are connected by a connecting section 630. The spiral coil 610, spiral coil 620 and connecting section 630 together form a structure similar to the semiconductor element 300, and thus the details are omitted for brevity. The spiral coils 640 and 650 are directly connected to the spiral coils 610 and 620, respectively. In one embodiment, when an application circuit coupled to the semiconductor element 600 processes differential signals (i.e., the connecting terminals 611 and 621 are coupled to a differential signal pair of the application circuit), the directions of the electric currents flowing through the spiral coils 610 and 620 are both clockwise or counterclockwise. The direction of the electric current flowing through the spiral coil 640 is opposite to that of the electric current flowing through the spiral coil 610, and the direction of the electric current flowing through the spiral coil 650 is opposite to that of the electric current flowing through the spiral coil 620. As an exemplary embodiment shown in FIG. 6, the spiral coils 640 and 650 are one-turn structures, but the number of turns may be different in another embodiment. The spiral coils 640 and 650 can be implemented in metal layers different from the spiral coils 610 and 620. For the arrangement of the spiral coil 610 and spiral coil 620, electromagnetic coupling signals from top, bottom, left and right can be mutually canceled in the near field portion. The 8-shaped inductor, however, can only cancel electromagnetic coupling signals from top and bottom, or left and right.

Figure 7:
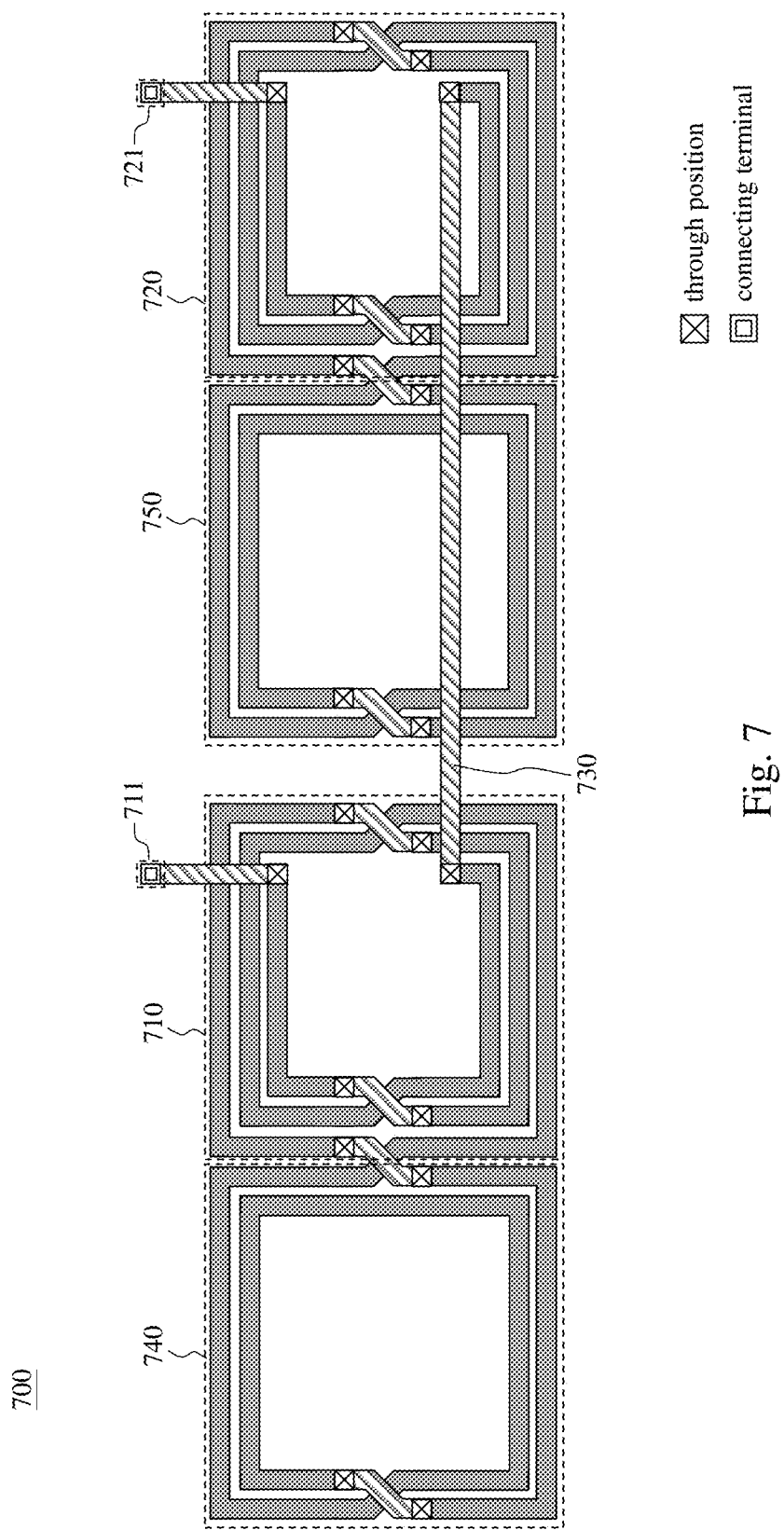
FIG. 7 illustrates a structure of a semiconductor element according to another embodiment of the present invention.

FIG. 7 shows a structure of a semiconductor element according to another embodiment of the present invention. The semiconductor element 700 includes spiral coils 710, 720, 740 and 750. The spiral coils 710 and 720 are connected by a connecting section 730. The spiral coil 710, spiral coil 720 and connecting section 730 together form a structure similar to the semiconductor element 400, and thus the details are omitted for brevity. The spiral coils 740 and 750 are directly connected to the spiral coils 710 and 720, respectively. The spiral coil 750 is located between the spiral coil 710 and the spiral coil 720. In other words, the connecting section 730 crosses the spiral coil 750. In one embodiment, when an application circuit coupled to the semiconductor element 700 processes differential signals (i.e., the connecting terminals 711 and 721 are coupled to a differential signal pair of the application circuit), the directions of the electric currents flowing through the spiral coils 710 and 720 are both clockwise or counterclockwise. The direction of the electric current flowing through the spiral coil 740 is opposite to that of the electric current flowing through the spiral coil 710, and the direction of the electric current flowing through the spiral coil 750 is opposite to that of the electric current flowing through the spiral coil 720. As an exemplary embodiment shown in FIG. 7, The spiral coils 740 and 750 are two-turn structures, but the number of turns may be different in another embodiment. The spiral coils 740 and 750 can be implemented in metal layers different from the spiral coils 710 and 720.

Figure 8:
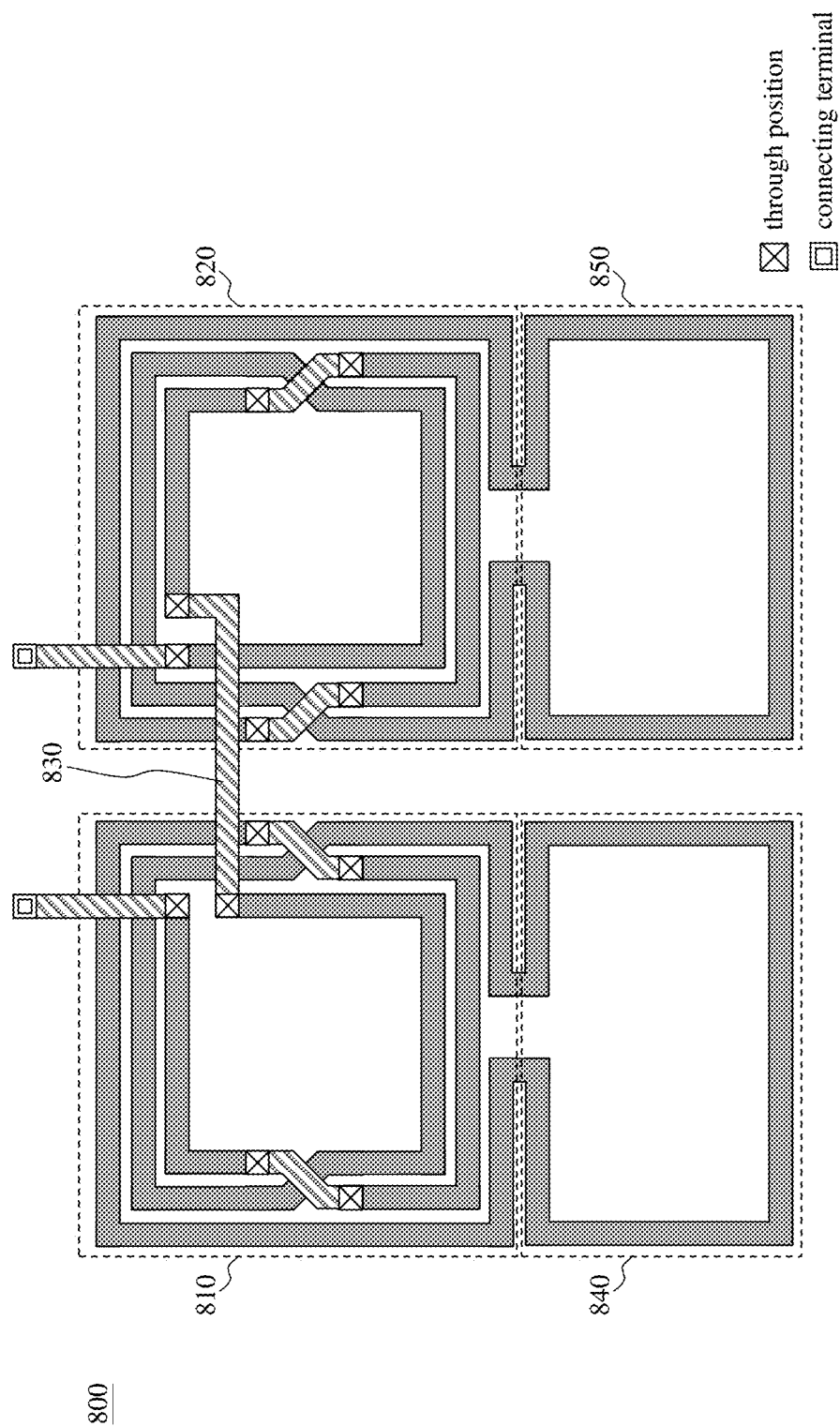
FIG. 8 illustrates a structure of a semiconductor element according to another embodiment of the present invention.

FIG. 8 shows a structure of a semiconductor element according to another embodiment of the present invention. The semiconductor element 800 includes spiral coils 810, 820, 840 and 850. The spiral coils 810 and 820 are connected by a connecting section 830. The semiconductor element 800 and semiconductor element 600 have similar structures, but the spiral coils 810 and 840 (or the spiral coils 820 and 850) are not connected by a crossing structure. As a result, the directions of the electric currents flowing through the spiral coils 810 and 840 of the semiconductor element 800 are the same, and the directions of the electric currents flowing through the spiral coils 820 and 850 of the semiconductor element 800 are the same. Thus, the semiconductor element 600 and semiconductor element 800 have different forms of magnetic field induction. Such flexible design allows the semiconductor elements of the present invention to evenly cancel external magnetic fields in a variety of applications. Similarly, the connecting structure in FIG. 8 can also be used to connect two coils of the semiconductor elements shown in FIGS. 5 and 7, such that the two directly-connected (as opposed to being connected through a connecting section) coils have the same direction of electric currents (both clockwise or counterclockwise).

The four spiral coils in FIGS. 5 and 7 can be arranged in a grid pattern as shown in FIG. 6 or 8; similarly, the four spiral coils in FIGS. 6 and 8 can be arranged in a row as shown in FIG. 5 or 7. However, when the semiconductor element of the present invention includes four coils, the arrangement of the four coils are not limited to the those shown in FIGS. 5 to 8. The spiral coil of the present invention is not limited to a quadrilateral, and may be in the form of other polygons or even a circle.

Please note that in the embodiments shown in FIGS. 2 to 8 the metal layer shaded by slanted lines is located above the metal layer shaded in gray, but in other embodiments the metal layer shaded by slanted lines can be located under the metal layer shaded in gray. The shape, size, and ratio of any element in the disclosed figures are exemplary for understanding, not for limiting the scope of this invention. Further, an integrated inductor or integrated transformer is taken merely as an example, but not a limitation, in the foregoing embodiments for illustrating the application of the present invention. People having ordinary skill in the art can apply the present invention to other types of semiconductor elements according to the disclosure of the present invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A semiconductor element, implemented in a semiconductor structure, coupled to an application circuit through at least two connecting terminals, said semiconductor element comprising:
    a first spiral coil, substantially located in a first metal layer, formed with a first end and a second end;
    a second spiral coil, substantially located in said first metal layer, formed with a third end and a fourth end;
    a first guide segment, connected to said first end and one of said two connecting terminals;
    a second guide segment, connected to said third end and the other of said two connecting terminals;
    a connecting section, located in a second metal layer, connected to said second end and said fourth end;
    a third spiral coil directly connected to said first spiral coil; and
    a fourth spiral coil directly connected to said second spiral coil;
    wherein, said second metal layer is different from said first metal layer, and electric current entering said first spiral coil passes through a substantially half of said first spiral coil before entering said third spiral coil.

2. The semiconductor element of claim 1, wherein said application circuit processes a differential signal, and when a direction of electric current of said first spiral coil is clockwise, a direction of electric current of said second spiral coil is counterclockwise.

3. The semiconductor element of claim 1, wherein said application circuit processes a differential signal, and a direction of electric current of said first spiral coil and a direction of electric current of said second spiral coil are both clockwise or counterclockwise.

4. The semiconductor element of claim 1, wherein a direction of electric current of said third spiral coil is opposite to a direction of electric current of said first spiral coil, and a direction of electric current of said fourth spiral coil is opposite to a direction of electric current of said second spiral coil.

5. The semiconductor element of claim 1, wherein a direction of electric current of said third spiral coil is the same as a direction of electric current of said first spiral coil, and a direction of electric current of said fourth spiral coil is the same as a direction of electric current of said second spiral coil.

6. The semiconductor element of claim 1, wherein said fourth spiral coil is located between said first spiral coil and said second spiral coil, and said connecting section crosses said fourth spiral coil.

7. The semiconductor element of claim 1, wherein electric current entering said semiconductor element via one of said two connecting terminals passes through all of said first spiral coil and all of said third spiral coil before entering the second spiral coil via the connecting section.

8. The semiconductor element of claim 1, wherein said first spiral coil comprises a first inner turn and a first outer turn, said second spiral coil comprises a second inner turn and a second outer turn, said first end and said second end are located at said first inner turn, and said third end and said fourth end are located at said second inner turn.

9. The semiconductor element of claim 8, wherein said first spiral coil and said second spiral coil are substantially symmetric with respect to an axis of symmetry, respectively, said first end and said third end are located on one side of said axis of symmetry, and said second end and said fourth end are located on the other side of said axis of symmetry.

10. The semiconductor element of claim 8, wherein said first spiral coil and said second spiral coil are substantially symmetric with respect to an axis of symmetry, respectively, and said first end, said second end, said third end and said fourth end are located on a same side of said axis of symmetry.

11. A semiconductor element, implemented in a semiconductor structure, coupled to an application circuit through at least two connecting terminals, said semiconductor element comprising:
   a first spiral coil, substantially located in a first metal layer, formed with a first end and a second end, said first end being one of said two connecting terminals;
   a second spiral coil, substantially located in said first metal layer, formed with a third end and a fourth end, said third end being the other of said two connecting terminals;
   a connecting section, located in a second metal layer, connecting said second end and said fourth end;
   a third spiral coil directly connected to said first spiral coil; and
   a fourth spiral coil directly connected to said second spiral coil;
   wherein, said second metal layer is different from said first metal layer, and electric current entering said first spiral coil passes through a substantially half of said first spiral coil before entering said third spiral coil.

12. The semiconductor element of claim 11, wherein said application circuit processes a differential signal, and when a direction of electric current of said first spiral coil is clockwise, a direction of electric current of said second spiral coil is counterclockwise.

13. The semiconductor element of claim 11, wherein said application circuit processes a differential signal, and a direction of electric current of said first spiral coil and a direction of electric current of said second spiral coil are both clockwise or counterclockwise.

14. The semiconductor element of claim 11, wherein a direction of electric current of said third spiral coil is opposite to a direction of electric current of said first spiral coil, and a direction of electric current of said fourth spiral coil is opposite to a direction of electric current of said second spiral coil.

15. The semiconductor element of claim 11, wherein a direction of electric current of said third spiral coil is the same as a direction of electric current of said first spiral coil, and a direction of electric current of said fourth spiral coil is the same as a direction of electric current of said second spiral coil.

16. The semiconductor element of claim 11, wherein said fourth spiral coil is located between said first spiral coil and said second spiral coil, and said connecting section crosses said fourth spiral coil.

17. The semiconductor element of claim 11, wherein electric current entering said semiconductor element via one of said two connecting terminals passes through all of said first spiral coil and all of said third spiral coil before entering the second spiral coil via the connecting section.

18. The semiconductor element of claim 11, wherein said first spiral coil comprises a first inner turn and a first outer turn, said second spiral coil comprises a second inner turn and a second outer turn, said first end and said second end are located at said first inner turn, and said third end and said fourth end are located at said second inner turn.

19. The semiconductor element of claim 18, wherein said first spiral coil and said second spiral coil are substantially symmetric with respect to an axis of symmetry, respectively, said first end and said third end are located on one side of said axis of symmetry, and said second end and said fourth end are located on the other side of said axis of symmetry.

20. The semiconductor element of claim 18, wherein said first spiral coil and said second spiral coil are substantially symmetric with respect to an axis of symmetry, respectively, and said first end, said second end, said third end and said fourth end are located on a same side of said axis of symmetry.

* * * * *